United States Patent [19]

Shirazi et al.

[11] Patent Number: 5,408,202
[45] Date of Patent: Apr. 18, 1995

[54] PHASE LOCK LOOP HAVING A LOCK ACQUISITION MODE AND METHOD OF OPERATION THEREFOR

[75] Inventors: Gadi Shirazi, Ramat Gan; Eyal Fayne, Givatayim; David Pincu, Holon, all of Israel

[73] Assignee: Motorola, Schaumburg, Ill.

[21] Appl. No.: 83,156

[22] Filed: Jun. 25, 1993

[30] Foreign Application Priority Data

Jun. 26, 1992 [GB] United Kingdom ............... 9213624

[51] Int. Cl.$^6$ ..................... H03L 7/093; H03L 7/107
[52] U.S. Cl. ............................ 331/8; 331/17; 331/25
[58] Field of Search ............ 331/1 A, 8, 15, 16, 331/17, 25, DIG. 2; 307/221

[56] References Cited

U.S. PATENT DOCUMENTS

| | | | |
|---|---|---|---|
| 3,566,088 | 2/1971 | Crook | 307/321 X |
| 5,151,665 | 9/1992 | Wentzler | 331/17 X |
| 5,153,530 | 10/1992 | Takagi et al. | 331/17 |
| 5,162,762 | 11/1992 | Flanagan | 331/15 |
| 5,164,685 | 11/1992 | Niemio | 331/8 |
| 5,173,665 | 12/1992 | Norimatsu | 331/25 |
| 5,233,314 | 8/1993 | McDermott et al. | 331/8 X |

FOREIGN PATENT DOCUMENTS 9213624.1 7/1992 European Pat. Off.
1215121 8/1989 Japan.
82/02309 7/1982 WIPO.

*Primary Examiner*—David Mis
*Attorney, Agent, or Firm*—Charles W. Bethards

[57] ABSTRACT

A phase lock loop comprises a phase detector (11), a frequency adjuster (13, 15) for adjusting and cancelling phase differences detected by said phase detector (11) and responsive thereto, and a filter (12) coupled between said phase comparator (11) and said frequency adjuster (13, 15). The phase lock loop has a first and a second operating mode (FIG. 5). Operation in said first operating mode is used to establish an initial lock acquisition to a desired output signal $f_{out}$ and uses a relatively wide bandwidth within the filter (12). At a transition from said first operating mode to said second operating mode, initial lock acquisition is lost, whereafter said second operating mode is used to re-establish final lock acquisition to the desired output frequency $f_{out}$. A gain adjuster (15) commences the controlled adjustment of the gain of said phase comparator (11) at a transition between said first and said second operating modes. Moreover, said gain adjuster (15) adjusts the gain of said phase detection means (11) in a gradual manner defined by a decreasing function whereby the bandwidth of the filter (12) is controllably reduced to substantially that of a relatively narrow bandwidth at a time after lock acquisition has been re-established.

12 Claims, 2 Drawing Sheets

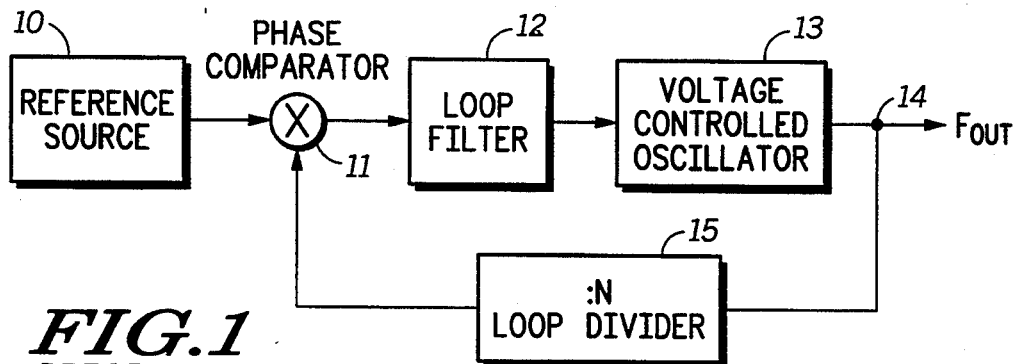
FIG.1 —PRIOR ART—
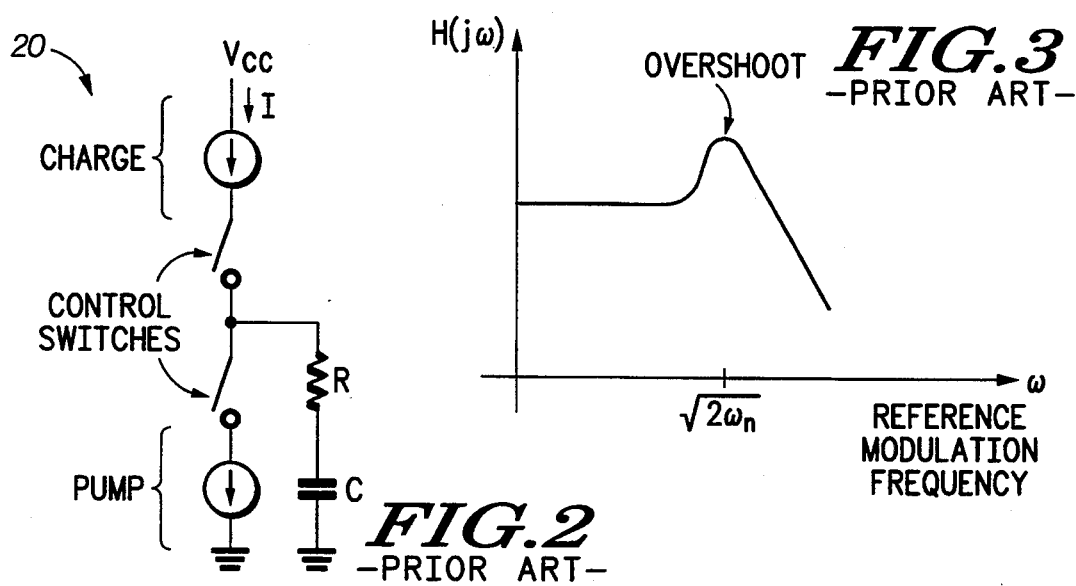
FIG.2 —PRIOR ART—
FIG.3 —PRIOR ART—
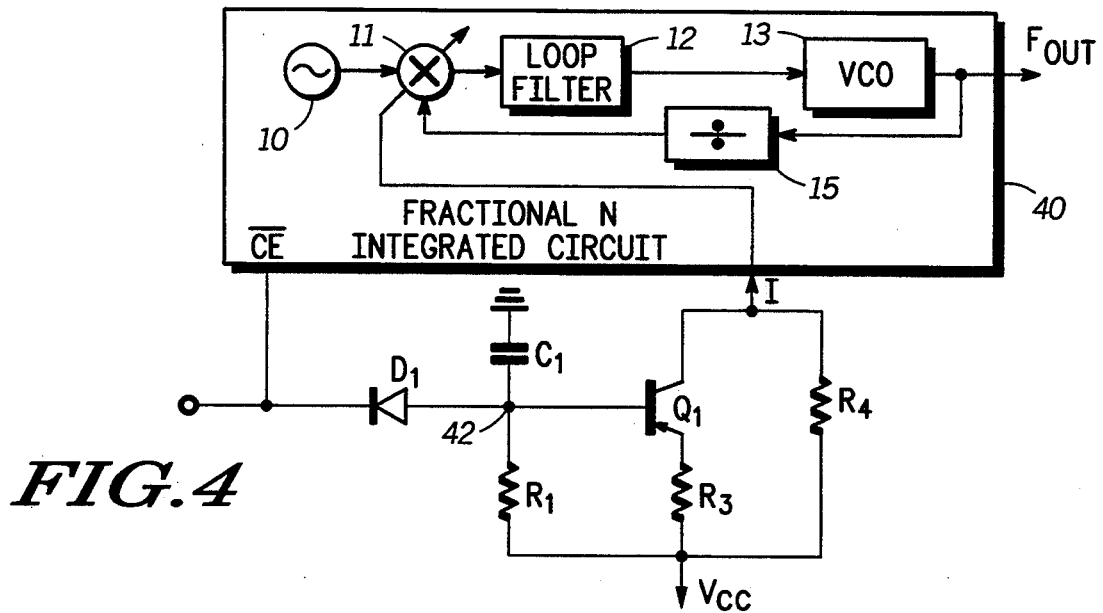
FIG.4

PHASE LOCK LOOP HAVING A LOCK ACQUISITION MODE AND METHOD OF OPERATION THEREFOR

BACKGROUND TO THE INVENTION

This invention relates, in general, to phase lock-loops and is particularly, but not exclusively, applicable to phase lock-loops employing fractional "N" loop divider technology and their subsequent application in radio communications equipment.

SUMMARY OF THE PRIOR ART

Modern radio communications equipment relies on synthesiser technology in order to create a plurality of channels located at different frequencies. A radio controller section, within the communications equipment, programs a transmitter and receiver section of the equipment with these different channels. It is a fundamental requirement that these frequencies are an accurate multiple of an accurate reference source. Typically, the reference source is an accurate local oscillator. In order that accurate frequencies are obtained for the radio communications equipment, a phase lock-loop is utilised.

A typical phase lock loop comprises a reference source or oscillator, a phase comparator, a loop filter and a voltage controlled oscillator. The voltage controller oscillator provides an output signal which is tapped to provide an input to a loop divider. The loop divider may be a fractional "N" loop divider. The phase lock loop changes the output frequency in response to a control voltage generated by the phase comparator. The output signal is divided by the loop divider and fed to the phase comparator which compares the signal to a reference signal provided by the reference source or oscillator. The phase comparator issues a suitable correction signal to the voltage controlled oscillator through the loop filter.

In a prior art phase lock loop, there are two alternative embodiments for the loop divider. A first embodiment comprises a loop divider which can only divide in integer divisions. Since the output frequency is equal to an integer value N multiplied by the reference frequency obtained from the reference source or oscillator, the reference frequency needs to be set at a required integer channel separation, e.g. a 12.5 kHz reference frequency needs to be established in order that a channel separation of 12.5 kHz is achieved. In this first prior art embodiment, there are two distinct drawbacks. First, the reference signal leaks through the phase comparator with the consequence that this leakage has to be suppressed by the loop filter. Moreover, if the leakage is not properly attenuated, it may cause degradation in receiver selectivity. In order to compensate for this degradation, a very narrow bandwidth loop filter is implemented within the phase lock loop. Unfortunately, the implementation of such a narrow bandwidth loop filter causes microphonics sensitivity and a considerable increase in the lock time for the phase lock loop. Second, noise generated by the reference frequency is increased by a factor of $20 \log N$ where N is the integer value of the loop divider. Typically, when using a 12.5 kHz reference frequency on a 900 MHz output frequency, the noise may increase by more than 60 dB (decibels). This increase in reference noise again forces the implementation of a narrow loop filter within the phase lock-loop. A second embodiment for the phase lock-loop replaces the integer loop divider with a fractional "N" loop divider. The fractional "N" loop divider is an integrated circuit which uses advanced timing and programming methods to create a division by non integer values. Therefore, a high reference frequency is obtainable whilst achieving a desired output frequency resolution. Implementation of a fractional "N" loop divider eliminates the requirement for a very narrow bandwidth loop filter and hence improves the lock time and microphonics objection. Unfortunately, the fractional "N" division may, at certain operating conditions, cause the generation of spurious signals, known as "spurs". The generation of spurs is unacceptable and results in the abandonment of narrow bandwidth loop filters and a return to the deficiencies associated with an integer loop divider.

It can be appreciated that there is a requirement within the art for a phase lock loop with a fast initial lock time and a narrow bandwidth, producing high selectivity within a receiver of a communications device, at all other times.

SUMMARY OF THE INVENTION

This invention addresses at least some of the deficiencies which arise in the prior art described above. In accordance with a preferred embodiment of the present invention there is provided a phase lock loop having a first operating mode and a second operating mode. The phase lock loop comprises phase detection means for detecting phase differences in the phase lock loop and operable in said first and second operating modes, an output for providing a desired frequency output and frequency adjustment means, responsive to the phase detection means, for adjusting and cancelling phase differences detected by the phase detection means and having an output for providing an output signal to said output. The phase lock loop further comprises filtering means, operable in said first and second operating modes, coupled between the phase detection means and the frequency adjustment means and responsive to the phase detection means, and gain adjustment means responsive to said output signal and coupled to the phase detection means for the gain control thereof. Gain adjustment means commences the controlled adjustment of the gain of the phase detection means at a transition between said first and said second operating modes. In first operating mode, the gain adjustment means adjusts the gain of the phase detection means to a relatively high value whereby the filtering means operates with a relatively wide bandwidth. The first operating mode is used to establish, to within a first tolerance of said desired output signal $f_{out}$, an initial lock acquisition in the phase lock loop.

A transition between said operating modes causes the phase lock loop to temporary lose lock acquisition obtained in said first operating mode. Operation in the second operating mode is characterised in that the gain adjustment means adjusts the gain of the phase detection means in a gradual manner defined by a decreasing function whereby the bandwidth of the filtering means is reduced to substantially that of a relatively narrow bandwidth at a time after lock acquisition has been re-established. The second operating mode is used to establish a final lock acquisition at substantially the desired output frequency $f_{out}$ In the preferred embodiment, the first tolerance is 500 Hz. Furthermore, the gradual decreasing function is preferably an exponentially decreasing function. Moreover, the gradual decreasing function may have a first portion which has a relatively slow rate of decrease in the slope thereof and a second portion which has a relatively fast rate of decrease in the slope thereof. In the preferred embodiment of the present invention, lock acquisition is re-established before phase lock loop data transmission requirements are violated. In addition, the bandwidth of the filtering means is controllably reduced to substantially that of the relatively low bandwidth within a predetermined time and before generation of spurious frequencies, emanating from said gain control means, are likely to occur. Furthermore, the phase lock loop may be implemented using fractional "N" technology.

An exemplary embodiment of the present invention will now be described with reference to the accompanying drawings.

BRIEF DESCRIPTION OF THE DRAWINGS

FIG. 1 illustrates a prior art phase lock loop.

FIG. 2 illustrates a typical charge pump configuration.

FIG. 3 illustrates a graph of a closed loop parameter for the phase lock loop of FIG. 1.

FIG. 4 illustrates a preferred embodiment of a circuit for charging a fractional "N" loop divider in accordance with the present invention.

DETAILED DESCRIPTION OF A PREFERRED EMBODIMENT

Figure 5:
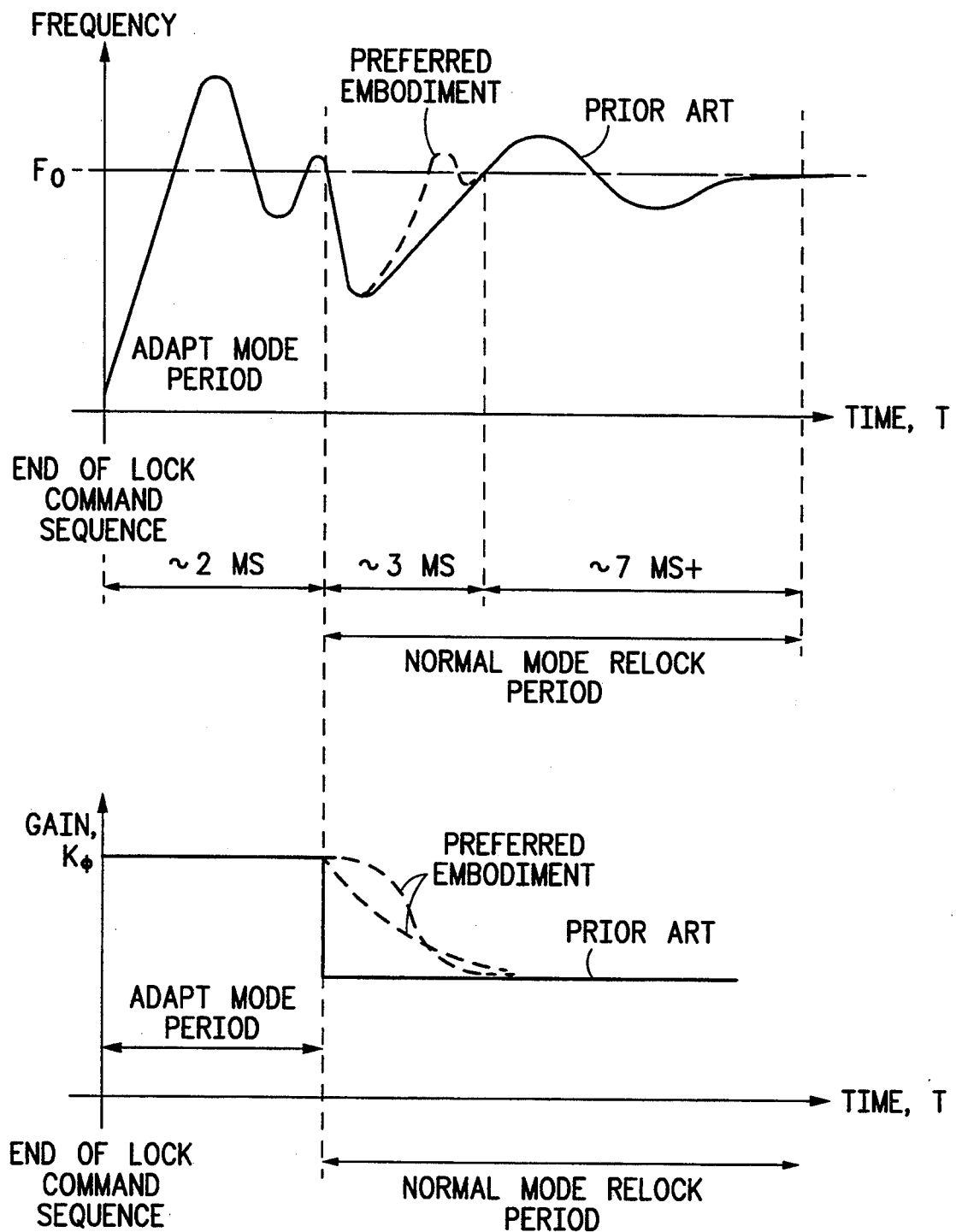
FIG. 5 illustrates a timing diagram comparing lock acquisition times for the prior art phase lock loop of FIG. 1 and the preferred embodiment of the invention.

Referring to the phase lock loop of FIG. 1, a reference source or oscillator 10 is coupled to a first input of a phase comparator 11. An output from the phase comparator is coupled to a loop filter 12 and an output from loop filter 12 is coupled to a voltage controlled oscillator 13. The voltage controller oscillator 13 provides an output $f_{out}$ which is tapped 14 to provide an input to a loop divider 15. The loop divider may be a fractional "N" loop divider. An output from the loop divider 15 provides a second input to the phase comparator 11.

The phase lock loop of FIG. 1 changes the output frequency in response to a control voltage generated by the phase comparator 11. The output signal four is divided by the loop divider 15 and fed to the phase comparator 11 which compares the signal to a reference signal provided by the reference source or oscillator 10. The phase comparator 11 issues a suitable correction signal to the voltage controlled oscillator 13 through the loop filter 12.

FIG. 2 illustrates a prior art charge pump 20. A voltage source $V_{cc}$ provides a current I which is either directly sunk to ground or sunk to ground through a serially coupled resistor-capacitor (RC) combination of loop filter 12. A pair of control switches, coupled in series, determine the path of the current I through the circuit. Such a charge pump acts as a digital phase comparator 11. The digital phase comparator determines whether to charge or discharge (pump) the loop filter 12. The determination is made according to the calculated frequency and phase error between the reference and divided signals.

The closed loop equation of the phase lock loop of FIG. 1 is related to the different phases in the loop.

$$\frac{\Phi_{out}(s)}{\Phi_{ref}(s)} \approx \frac{K_\phi K_v F(s)}{S + \left(\frac{K_\phi K_v}{N}\right) F(s)}$$

where, $\Phi_{out}$ is the phase relation of the output signal;
$\Phi_{ref}$ is the phase relation of the reference signal;
$K_\phi$ is the phase comparator gain;
$K_v$ is the voltage controlled oscillator gain [MHz+V];
N is the division ratio; and
F(s) is the loop filter transfer function.

For the charge pump illustrated in FIG. 2, the approximate closed loop parameter is $$\omega_n = \sqrt{\left(\frac{K_\phi K_v}{NC}\right)}$$

where,
the damping factor $$\xi = \left(\frac{\omega_n}{2}\right) RC;$$

and
$\omega_n$ is the natural frequency.

FIG. 3, illustrates that the phase loop lock of FIG. 1 behaves as a low pass filter with a bandwidth proportional to $\omega_n$. Furthermore, the size of the overshoot is determined by the damping factor $\xi$. In addition, the time it takes the phase lock loop to stabilise the output frequency $f_{out}$ to a steady state frequency (i.e. the lock time) is proportional to $1/\omega_n$. Clearly, a reference modulation frequency with a large value for $\omega_n$ leads to a shorter lock time. Lock time is defined as the time taken for a PLL to lock to within a tolerance of ±500 Hz of a required frequency.

The present invention addresses the problem of having both a wide bandwidth for a loop filter 12 of a phase lock loop during an initial lock acquisition period, therein minimising the lock acquisition time, and a narrow bandwidth at all other times. Specifically, a preferred embodiment of the present invention switches an element to widen the loop bandwidth during the lock acquisition period and then switches the element back to a narrow bandwidth after lock acquisition has been achieved. Problems within the phase lock loop associated with abrupt switching, such as loop rupture or a temporary out of lock situation (caused by large phase and frequency errors), are overcome by varying the rate of the gain of the phase lock loop.

From above, the natural frequency $\omega_n$ is directly proportional to the phase comparator gain $K_\phi$. The gain of the phase comparator is $$K_\phi = \frac{I_{chargepump}}{\pi}.$$

It can be seen that the natural frequency $\omega_n$ is directly proportional to the current going through the charge pump. FIG. 4 illustrates a preferred embodiment of a circuit which increases the gain of the phase comparator 11 during the lock acquisition period and then gradually and continuously decreases the gain thereof to a low steady state value. It is this gradual and continuous decrease which achieves spur performance optimisation. Moreover, not only is the reduction in the gain gradual and continuous, but it is also devoid of any abrupt changes, such as those exhibited in a step function. It will be appreciated by one skilled in the art that a step function can be, in the limit, considered as a non-abrupt function provided that the steps are of sufficiently small increments and, as such it is not the intention of the applicant to preclude such a step function.

A fractional "N" integrated circuit 40, comprises an internal charge pump biasing input 41 and a low chip enable ($\overline{CE}$). A resistor $R_4$ is coupled between the internal charge biasing input 41 and a power supply $V_{cc}$, typically +5 V. The internal charge pump biasing input 41 and a collector electrode of a transistor $Q_1$ are coupled together. An emitter electrode of transistor $Q_1$ is coupled to the power supply $V_{cc}$ through a further resistor $R_3$. Resistor $R_3$ is also coupled to resistor $R_4$. Resistor $R_1$ is coupled to between circuit node 42 and resistors $R_3$, $R_4$ and power supply $V_{cc}$. Circuit node 42 is coupled to the base of transistor $Q_1$ and the anode terminal of a diode $D_1$. Furthermore, circuit node 42 is coupled through a capacitor $C_1$ to ground potential. The cathode of diode $D_1$ is coupled to $\overline{CE}$ input of the fractional "N" integrated circuit 40.

A modern fractional "N" integrated circuit typically comprises two phase detectors 11. The first phase detector operates in the so called "adapt" mode and is used to establish the initial charge on a loop filter capacitor. In order to establish this initial charge, there is a relatively high current flow during this adapt mode period. The adapt mode terminates after a predetermined period, typically between 0.24 ms and 3.3 ms. When an initial charge has been established on the capacitor, the fractional "N" integrated circuit changes to a second operating mode. This operating mode is named the "normal" mode and it is in this mode that the phase lock loop acquires final lock to the output frequency $f_{out}$.

By gradually decreasing the phase comparator gain $K_\phi$, the preferred embodiment of the circuit of FIG. 4 establishes the output frequency $f_{out}$ without the generation of spurious signals and thereby reduces the chance of loop rupture and loss of lock acquisition. Operating conditions in the normal mode are phase and gain immunity, narrow bandwidth and stability of the phase lock loop.

To avoid spur performance i.e. the generation of additional spurious frequencies, the preferred embodiment of the present invention establishes a narrow operating bandwidth ~300 Hz within 3 ms of switching to the normal mode. In addition, the preferred embodiment of the present invention acquires lock acquisition within 5 ms of switching to the normal mode. By achieving lock acquisition in this time, data transmission requirements for a system are satisfied. It can be seen that the relationship between lock acquisition and the establishment of the narrow operating bandwidth is approximately 6:1. Empirical results indicate that this relationship may be adjusted by ±20% without causing significant degradation in operational performance. It will be appreciated by one skilled in the art that it is the gradual, continuous and non-abrupt decrease in the gain coupled with loop timing requirements which generate the considerable advantage derived from the invention. It will further be appreciated that the final narrow operating bandwidth of ~300 Hz is only limited to this bandwidth by present technological considerations; particularly those associated with microphonics. Moreover, the narrow bandwidth is substantially achieved within the specified period and this period is not considered to be an absolute or limiting criterion. In a similar manner, the time (5 ms) in which lock acquisition is achieved may be reduced subject to the advancement of technology.

Resistor $R_4$ sets the steady state current according to the formula $$I = \frac{(V_{cc} - 2)}{R_4} \approx \frac{(5 - 2)}{R_4} \tag{1}$$

i.e.

$$I = \frac{3}{R_4}.$$

Now, transistor $Q_1$ produces a "soft" connection and disconnection of resistor $R_3$ in parallel with resistor $R_4$. That is to say, when capacitor $C_1$ is charging, the resistance between the emitter electrode and the collector electrode of transistor $Q_1$ is reduced proportionally. When the base of the transistor is at a potential of approximately 4.7 V, transistor $Q_1$ is in a state of saturation. The gradual introduction of the resistive component of resistor $R_4$ increases the current I to $$I = \frac{3}{(R_3 // R_4)}. \tag{2}$$

Diode $D_1$, capacitor $C_1$ and Resistor $R_1$ serve as a timing circuit and determine the duration of operation of the fractional "N" integrated circuit in either of the two operating modes. At steady state conditions, i.e. when an accurate output signal $f_{out}$ has been established, the $\overline{CE}$ pin of the fractional "N" integrated circuit 40 is tied at a potential of $V_{cc}$. Furthermore, capacitor $C_1$ is charged to $V_{cc}$ through resistor $R_1$. Diode $D_1$ and transistor $Q_1$ are cut off and, hence, resistor $R_3$ is disconnected.

When the fractional "N" integrated circuit 40 is selected through the activation of $\overline{CE}$, diode $D_1$ begins to conduct and capacitor $C_1$ discharges until the voltage across the capacitor $V_C$ is $\approx 0.7$ V.

Until the voltage across the diode $V_D$ reaches approximately 4.3 V resistor $R_3$ does not conduct and the phase comparator gain $K_f$ is high which, consequentially, provides fast initial lock acquisition. Fast initial lock acquisition is maintained whilst fractional "N" integrated circuit 40 operates in the "adapt" mode.

When the voltage across the diode $V_D$ reaches approximately 4.3 V, resistor $R_3$ begins to conduct. The resistance of resistor $R_3$ is, therefore, gradually introduced into the parallel configuration of $R_3$ and $R_4$ and, hence, the resistance of the parallel $R_3$ and $R_4$ configuration is reduced. This reduction causes a decrease in the phase comparator gain $K_f$.

[In the normal mode,] The variation of the resistance coupled to the internal biasing input 41 causes a gradual and continual decrease in the gain.

In this manner, fast re-acquisition of the output frequency $f_{out}$ is achieved. FIG. 5 compares the prior art acquisition time to that for the preferred embodiment of the present invention. Empirical results indicate that a time saving for lock acquisition of between 60%–70% is achieved.

On de-selecting the fractional "N" integrated circuit 40, $\overline{CE}$ returns to a potential $+V_{cc}$ and diode $D_1$ ceases conduction and returns to a high impedance state. Therefore, capacitor $C_1$ charges to $+V_{cc}$. Consequentially, the conduction path through transistor $Q_1$ is restricted. Therefore, resistor $R_3$ is isolated and the series combination of resistor $R_4$ is the only resistance coupled to the internal biasing input 41.

In order to avoid excessive spurs, caused by extremely low current values in the normal mode of the fractional "N" integrated circuit 40, a nominal rating of 20 μA (microamps) for the circuit is selected. The maximum current rating for the fractional "N" integrated circuit is typically 120 μA. Therefore, the resistance of $R_4$ is calculated to be:

$$\frac{3V}{R_4} = 20 \,\mu A$$

$$\rightarrow R_4 = 150 k\Omega.$$

and $$\rightarrow R_3 = 30 k\Omega.$$

Since we expect the lock acquisition time to be approximately 5 milliseconds, we require a time constant $\tau$ for the RC combination $R_1C_1$ to be approximately 5 milliseconds. A time constant $\tau$ of approximately 5 milliseconds ensures that there is no meaningful degradation of the current distribution through transistor $Q_1$ during the lock acquisition period. For a capacitance value $C_1 = 1 \,\mu F$, resistor $R_1$ would be 5 kΩ.

Through the implementation of the preferred embodiment of the present invention, the improvement in lock time for the PLL is given by $$\frac{t_{lock\ (steady\ state,\ narrow\ bw)}}{t_{lock\ (adaptive\ state,\ wide\ bw)}} = \sqrt{\frac{K_\phi\ (adaptive)}{K_\phi\ (steady)}}$$

since $$t_{lock} \propto \frac{1}{\omega_n} \text{ and } \omega_n \propto \sqrt{K_\phi}$$

$$\rightarrow t_{lock} \propto \frac{1}{\sqrt{K_\phi}}$$

It can be appreciated that an invention so designed and described, produces the novel advantages of a phase lock-loop with a fast lock acquisition time for a desired output frequency four. Moreover, a 60%+ decrease in lock acquisition is achieved over the prior art configuration. Furthermore, the preferred embodiment of the present invention allows the use of a fractional "N" loop divider which may be properly attenuated and which therefore ensures a high level of receiver selectivity. In addition, there is an associated benefit derived from the ability to use a large bandwidth loop filter which reduces microphonics sensitivity and decreases lock time. Additionally, the preferred embodiment resolves the problems associated with spurious signals generated within prior art fractional "N" loop filters. Moreover, the preferred embodiment of the present invention allows a reduction in the loop filter bandwidth from the prior art value of ∼1 kHz to ∼300 Hz.

It will, of course, be understood that the above description has been given by way of example only and that modifications in detail, such as the use of an ordinary, i.e. non fractional, phase lock-loop can be made within the scope of the invention. Furthermore, the preferred embodiment of the invention comprises two normal charge pumps. Such a configuration enables use of a dual band voltage controlled oscillator in a phase lock loop having different loop filter gains $K_v$ for the different bands. In addition, the rate of change of the gradual, continuous and non-abrupt gain variation may vary with respect to time and therefore adopt alternative exponential functions to those illustrated in FIG. 5.

We claim:

1. A phase lock loop, having a first operating mode and a second operating mode, comprising an integrated circuit and a gain adjustment circuit, the integrated circuit comprising:
   a) phase detection means for detecting phase differences in said phase lock loop and operable in said first and second operating modes;
   b) an output for providing a desired frequency output;
   c) frequency adjustment means, coupled to said output and responsive to said phase detection means, for adjusting and canceling phase differences detected by said phase detection means and for providing an output signal to said output;
   d) filtering means, operable in said first and second operating modes, coupled between said phase detection means and said frequency adjustment means and responsive to said phase detection means; and
   g) an enable input for enabling operation of the integrated circuit; said gain adjustment circuit comprising:
   e) gain adjustment means coupled to said phase detection means for the gain control of said phase detection means and coupled to the enable input of the integrated circuit; wherein
   in response to an enable signal at the enable input, said gain adjustment means commences the controlled adjustment of the gain of said phase detection means and initiates a transition between said first and said second operating modes; and, in said first operating mode,
   i) said gain adjustment means adjusts the gain of said phase detection means to a relatively high value; and
   ii) said first operating mode is used to establish, to within a first tolerance of said desired frequency output, an initial lock acquisition in the phase lock loop;
   iii) said gain adjustment means adjusts the gain of said phase detection means in a gradual manner defined by a decreasing function; and
   iv) said second operating mode is used to establish a final lock acquisition at substantially the desired output frequency.

2. A phase lock loop in accordance with claim 1, wherein said first tolerance is 500 Hz.

3. A phase lock loop in accordance with claim 1, wherein the gradual decreasing function is an exponentially decreasing function.

4. A phase lock loop in accordance with claim 1, wherein the gradual decreasing function is characterised in that:
   a first portion of the function has a relatively slow rate of decrease in the slope thereof; and
   a second portion of the function has a relatively fast rate of decrease in the slope thereof.

5. A phase lock loop in accordance with claim 1, wherein lock acquisition is re-established within 5 milliseconds from said transition between operating modes.

6. A phase lock loop in accordance with claim 1, wherein the phase lock loop is implemented using fractional "N" integrated circuit technology.

7. A phase lock loop in accordance with claim 1, wherein the gain adjustment means comprises:
   a) selection means for selecting one of said first and said second operating modes;
   b) variable resistance means, responsive to said selection means, for varying the resistance of the gain adjustment means and thereby controllably adjusting the gain of said gain adjustment means;
   c) timing means, responsive to said selection means and said variable resistance means, for determining the rate at which the variable resistance means adjusts the gain.

8. A phase lock loop in accordance with claim 7, wherein:
   a) the variable resistance means comprises:
      i) a first resistor having relatively low resistance;
      ii) a second resistor having relatively high resistance; and
      iii) a transistor having a base electrode, collector electrode and an emitter electrode;
   wherein the second resistor is coupled in parallel with the series combination of said first resistor, said collector and said emitter;
   b) the selection means comprises a diode; and
   c) the timing means is a series coupled resistor-capacitor combination; wherein,
   an anode of the diode is coupled to the base of the transistor, and a mid-point of the resistor-capacitor combination of the timing means is coupled between said anode and said base electrode;
   the resistance of the circuit is reduced by the controlled introduction of the resistance provided by parallel resistor, as determined by the transistor; and
   such a reduction in the resistance causes the gain adjustment means to increase the gain of phase detector means.

9. A method for acquiring lock acquisition in an integrated phase lock loop circuit, having an enable input and coupled to a gain adjustment circuit, the gain adjustment circuit being coupled to the enable input of the integrated phase lock loop circuit, comprising the steps of:
   a) providing an enable signal to the enable input of the integrated circuit
   b) operating said phase lock loop and detecting phase differences in the phase lock loop with phase detection means;
   c) adjusting and canceling phase differences detected by said phase detection means and providing a frequency output signal;
   d) routing a portion of said frequency output signal, through a divider means, to provide a phase signal to said phase detection means;
   e) establishing initial lock acquisition, to within a first tolerance of a desired frequency output signal;
   f) in response to said enable signal, controllably adjusting the gain of said phase detector, thereby controllably reducing the bandwidth of said filtering means; and
   g) establishing final lock acquisition at substantially the desired output frequency and at a relatively narrow bandwidth for said filtering means; wherein
   said gain adjustment means adjusts the gain of said phase detection means in a gradual manner defined by a decreasing function initiated by said enable signal whereby the bandwidth of said filtering means is reduced to substantially that of the relatively narrow bandwidth at a time after lock acquisition has been re-established.

10. A phase lock loop, operable in a first operating mode and a second operating mode, and having an integrated circuit with an enable input and a gain adjustment circuit; said integrated circuit comprising
   a) phase detection means for detecting phase differences in said phase lock loop and operable in said first and second operating modes;
   b) an output for providing a desired frequency output;
   c) frequency adjustment means, coupled to said output and responsive to said phase detection means, for adjusting and canceling phase differences detected by said phase detection means and for providing an output signal to said output;
   d) filtering means, operable in said first and second operating modes, coupled between said phase detection means and said frequency adjustment means and responsive to said phase detection means; and
   e) gain adjustment means responsive to said frequency output signal and coupled to said phase detection means for the gain control of said phase detection means; wherein
   said gain adjustment circuit causes said gain adjustment means to commence the controlled adjustment of the gain of said phase detection means in response to an enable signal at said integrated circuit enable input and initiates a transition between said first and said second operating modes; and, in said first operating mode,
   i) said gain adjustment means adjusts the gain of said phase detection means from a relatively low value to a relatively high value whereby said filtering means changes from having a relatively narrow bandwidth to having a relatively wide bandwidth; and
   ii) said first operating mode is used to establish, to within a first tolerance of said desired output frequency signal, an initial lock acquisition in the phase lock loop;
   whereafter, the transition between said operating modes causes the phase lock loop to temporarily lose lock acquisition obtained in said first operating mode, and operation in said second operating mode is characterised in that:
   iii) said gain adjustment means adjusts the gain of said phase detection means in a gradual manner defined by a decreasing function; and
   iv) said second operating mode is used to establish a final lock acquisition at substantially the desired output frequency.

11. A phase lock loop in accordance with claim 10, wherein the gradual decreasing function is an exponentially decreasing function.

12. A phase lock loop, having an integrated circuit and a gain adjustment circuit, the integrated circuit comprising:
- a) phase detection means for detecting phase differences in said phase lock loop;
- b) an output for providing a desired frequency output;
- c) frequency adjustment means, coupled to said output and responsive to said phase detection means, for adjusting and canceling phase differences detected by said phase detection means and for providing an output signal to said output;
- d) filtering means coupled between said phase detection means and said frequency adjustment means and responsive to said phase detection means;
- e) an enable input for enabling operation of the integrated circuit; and
- f) a gain control input for controlling the gain of the phase lock loop; said gain adjustment circuit comprising:
- g) a resistor-capacitor circuit coupled to said gain control input for the gain control of said phase detection means and responsively coupled to the enable input of the integrated circuit; wherein in response to an enable signal at the enable input, said gain adjustment circuit commences controlled adjustment of the gain of said phase detection means causing said gain adjustment means to adjust the gain of said phase detection means from a relatively low value to a relatively high value in a gradual manner defined by a said resistor-capacitor circuit.

* * * * *